(12) United States Patent
Bisbee

(10) Patent No.: US 6,218,821 B1
(45) Date of Patent: Apr. 17, 2001

(54) COMPUTER STORAGE SYSTEM INCORPORATING MARGINABLE POWER SUPPLY AND POWER-UP BYPASS CIRCUIT

(75) Inventor: David Bisbee, Princeton, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/365,359

(22) Filed: Jul. 30, 1999

(51) Int. Cl.[7] .................................................. G05F 5/00
(52) U.S. Cl. ........................ 323/299; 363/49; 323/267
(58) Field of Search ................................. 323/267, 299, 323/303, 901; 363/49, 65, 74

(56) References Cited

U.S. PATENT DOCUMENTS

| | | | |
|---|---|---|---|
| 3,725,740 | 4/1973 | Kuster | 317/16 |
| 4,847,546 | * 7/1989 | Bobier et al. | 323/303 X |
| 5,332,960 | * 7/1994 | Kudoh | 323/299 |
| 5,659,208 | * 8/1997 | Kimble et al. | 363/65 |
| 5,847,549 | * 12/1998 | Dodson, III | 323/299 X |

* cited by examiner

Primary Examiner—Jessica Han
(74) Attorney, Agent, or Firm—Wolf, Greenfield & Sacks, P.C.

(57) ABSTRACT

A computer storage system includes director boards which control transfer of data to and between a host computer, a system cache memory and a disk array. The directors are provided with features which enhance system performance and reliability. A hardware emulation controller permits a high performance processor to be used with existing system circuitry. A control store memory is organized with primary and secondary data areas and primary and secondary parity areas. Data is written to both the primary and secondary areas. A read request accesses data in the primary area and performs a retry in the secondary area in the event of a parity error. A power supply system includes on-board marginable power supplies to facilitate testing and power-up by-pass circuits for protection of sensitive circuitry. A system clock configuration employs primary and secondary clocks to ensure redundancy of synchronized timekeeping.

17 Claims, 12 Drawing Sheets

COMPUTER STORAGE SYSTEM INCORPORATING MARGINABLE POWER SUPPLY AND POWER-UP BYPASS CIRCUIT

FIELD OF THE INVENTION

This invention relates to computer storage systems and, more particularly, to high performance controllers for disk array systems. The controllers incorporate marginable power supplies and power-up bypass circuits for testability, high reliability and controlled operation during power-up.

BACKGROUND OF THE INVENTION

Computer storage systems for high capacity, on-line applications are well known. Such systems use arrays of disk devices to provide a large storage capacity. To alleviate the delays inherent in accessing information in the disk array, a large capacity system cache memory is typically utilized. Controllers known as back end directors or disk adaptors control transfer of data from the system cache memory to the disk array and from the disk array to the system cache memory. Each back end director may control several disk devices, each typically comprising a hard disk drive. Controllers known as front end directors or host adaptors control transfer of data from the system cache memory to a host computer and from the host computer to the system cache memory. A system may include one or more front end directors and one or more back end directors.

The front end directors and the back end directors perform all functions associated with transfer of data between the host computer and the system cache memory and between the system cache memory and the disk array. The directors control cache read operations and execute replacement algorithms for replacing cache data in the event of a cache miss. The directors control writing of data from the cache to the disk array and may execute a prefetch algorithm for transferring data from the disk devices to the system cache memory in response to sequential data access patterns. The directors also execute diagnostic and maintenance routines. In general, the directors incorporate a high degree of intelligence.

Current computer storage systems are characterized by high performance and high reliability. Nonetheless, as the performance of the host computers which operate with the computer storage systems increases, it is necessary to provide computer storage systems having enhanced performance. In particular, operating speeds must be increased as the operating speeds of host computers increase. Furthermore, as the cost of computer memory decreases and program complexity increases, the volumes of data transferred increase. Because computer storage systems are frequently used in highly critical applications, reliability is an important consideration. The storage systems must remain operational, even when certain components and subsystems fail. Accordingly, the storage systems may incorporate redundant hardware and are extensively tested. Because the performance of computer storage systems is determined to a significant degree by the performance of the controllers, there is a need for very high performance, high reliability controllers for computer storage systems.

SUMMARY OF THE INVENTION

According to a first aspect of the invention, apparatus comprises a power supply for generating a first supply voltage that is variable within a first range, and an electronic circuit that is powered by the first supply voltage. The electronic circuit comprises a converter for converting the first supply voltage to a second supply voltage and a control circuit responsive to variations of the first supply voltage for controlling the converter such that the second supply voltage is maintained within a second range.

The control circuit may include a reference voltage source for generating a reference voltage and a voltage comparator for generating a trim voltage for controlling the converter in response to a difference between the first supply voltage and the reference voltage. The first range may be greater than the second range.

According to a second aspect of the invention, an electronic circuit is provided. The electronic circuit is powered by a first supply voltage that is variable within a first range. The electronic circuit comprises a converter for converting the first supply voltage to a second supply voltage, and a control circuit responsive to variations of the first supply voltage for controlling the converter such that the second supply voltage is maintained within a second range.

According to a third aspect of the invention, power supply apparatus comprises a power supply for generating a first supply voltage, and a bypass circuit for controlling the first supply voltage during power-up. The bypass circuit comprises a sensing circuit for comparing the first supply voltage and the second supply voltage and generating a control signal in response to a difference between the first and second power supply voltages, a control circuit responsive to the control signal for controlling the first supply voltage, and a reset circuit for enabling the control circuit during power-up and for inhibiting the control circuit during normal operation. The control circuit may comprise at least two FETs connected in series. The reset circuit preferably enables the FETs during power-up and inhibits the FETs during normal operation, independent of the control signal. The power supply may include a DC-DC converter which is inhibited during at least a portion of the power-up.

The bypass circuit may further comprise a test circuit for detecting a shorted condition of each of the FETs. The bypass circuit may further include means for simulating a shorted FET in response to a test signal.

According to a fourth aspect of the invention, a method is provided for controlling a supply voltage. The method comprises the steps of generating a first supply voltage that is variable within a first range, converting the first supply voltage to a second supply voltage using a DC-DC converter, and controlling the DC-DC converter such that the second supply voltage is maintained within a second range in response to variations of the first supply voltage.

According to a fifth aspect of the invention, a method is provided for controlling a supply voltage. The method comprises the steps of generating a first supply voltage, comparing the first supply voltage and a second supply voltage and generating a control signal in response to a difference between the first and second supply voltages, controlling the first supply voltage in response to the control signal during power-up, and enabling the control circuit during power-up and inhibiting the control circuit during normal operation.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
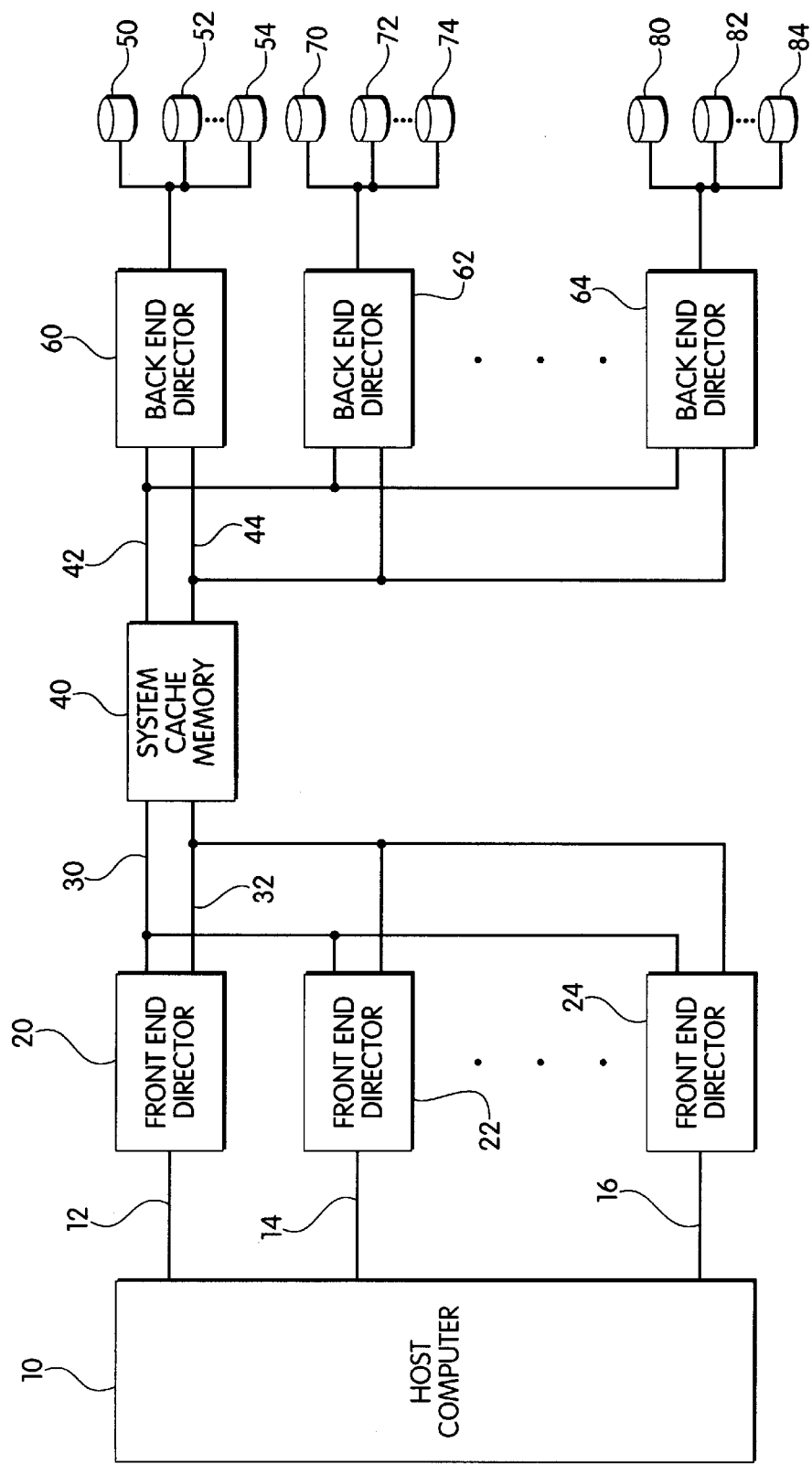
FIG. 1 is a block diagram of a computer storage system suitable for incorporation of the invention.

An example of a computer storage system suitable for incorporation of the present invention is shown in FIG. 1. A host computer 10 may be connected to the storage system using one or more channels or buses 12, 14, . . . 16. The channels for communication with host computer 10 can be any suitable connection, such as a small computer system interface (SCSI), enterprise systems connection architecture (ESCON) or fiber channel (FC).

The storage system includes one or more front end directors 20, 22, . . . 24, which are responsible for managing and translating read and write requests from host computer 10 into one or more requests corresponding to how data is stored on physical disk drives in the storage system. The front end directors 20, 22, . . . 24 are connected via buses 30 and 32 to a system cache memory 40. The system cache memory 40 may be a random access memory having greater speed than the disk drives. If data being read is temporarily stored in the cache, a read request can be fulfilled more quickly by taking the data from system cache memory 40. Similarly, when writing data, the data to be written can be stored in system cache memory 40. System operation can proceed, while data is written from the system cache memory to the appropriate disk drive. The front end directors 20, 22, . . . 24 can be implemented in a number of ways, including a general purpose processor or a custom hardware implementation.

System cache memory 40 is coupled to disk drives 50, 52, . . . 54 through a back end director 60. The storage system may include one or more back end directors, each connected to one or more disk drives. In the example of FIG. 1, system cache memory 40 is coupled to disk drives 70, 72, . . . 74 through a back end director 62 and is coupled to disk drives 80, 82, . . . 84 through a back end director 64. Each back end director 60, 62, . . . 64 may be implemented using a general purpose processor or a custom hardware implementation. Each back end director 60, 62, . . . 64 is connected to system cache memory 40 via buses 42 and 44. Each of the buses 30, 32, 42 and 44 may be implemented, for example, as a 72 bit parallel bus. The system cache memory 40 may be a dual port random access memory. In one example, each back end director 60, 62, . . . 64 controls four disk drives, and the system may include up to 256 disk drives. An example of a computer storage system having the general configuration shown in FIG. 1 and described above is the Symmetrix model 5700, manufactured and sold by EMC Corporation.

Figure 2:
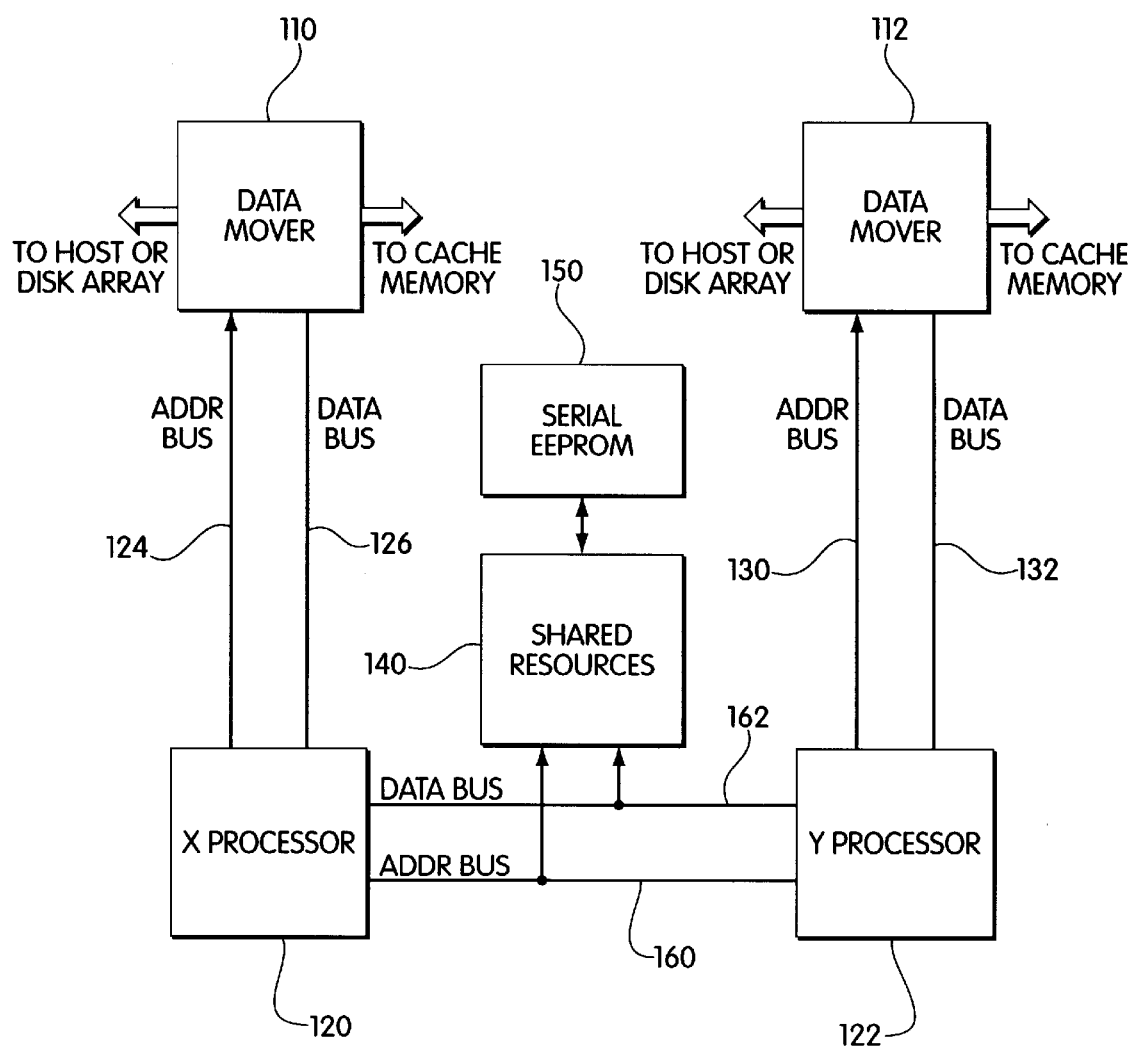
FIG. 2 is a simplified block diagram of a director.

A block diagram of an example of a suitable director architecture is shown in FIG. 2. In one embodiment, the same architecture may be used for front end directors 20, 22, . . . 24 and back end directors 60, 62, . . . 64. The director includes data movers 110 and 112, each of which constitutes a high speed data path between the host computer 10 and system cache memory 40 in the case of a front end director or a high speed data path between the disk array and the system cache memory 40 in the case of a back end director. Data movers 110 and 112 are respectively connected to data buses 30 and 32 (FIG. 1) or to data buses 42 and 44 (FIG. 1). Data movers 110 and 112 contain data transfer circuitry.

Data mover 110 is controlled by an X processor 120, and data mover 112 is controlled by a Y processor 122. The dual processor configuration provides high throughput and high efficiency in the operation of the computer memory system. The processors 120 and 122 include private resources required for high performance operation, such as local cache memory, a main memory, control circuitry and registers, as described below. X processor 120 is coupled to data mover 110 by a private address bus 124 and a private data bus 126. Y processor 122 is coupled to data mover 112 by a private address bus 130 and a private data bus 132.

The director also includes shared resources 140. Processors 120 and 122 and shared resources 140 are interconnected by a shared address bus 160 and a shared data bus 162. Shared resources 140 includes those resources which are not critical to the performance of processors 120 and 122. Shared resources 140 may include a variety of control functions, such as nonvolatile storage of software execution logs and error logs, nonvolatile storage of software for processors 120 and 122, and one or more connections to a local area network for diagnostic and maintenance purposes. The director may also include a serial EEPROM 150 for storage of product data, as described below.

Figure 3:
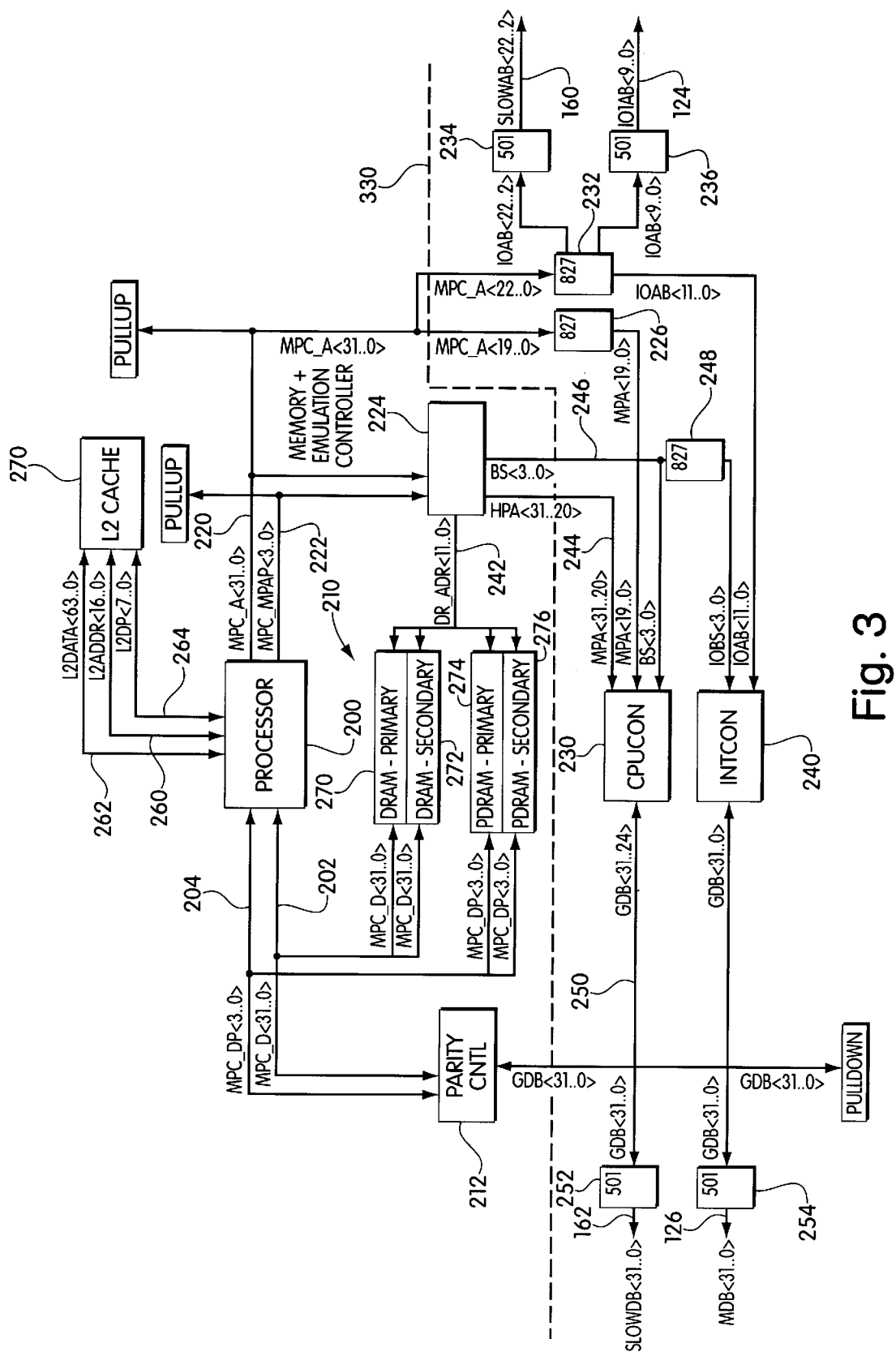
FIG. 3 is a block diagram that is representative of each processor shown in FIG. 2.

A block diagram of a processor, which is representative of X processor 120, is shown in FIG. 3. Y processor 122 may have the same configuration. A processor 200 includes a data bus 202 and a data parity bus 204 coupled to a control store memory 210 and a parity controller 212. Processor 200 also includes an address bus 220 and an address parity bus 222 coupled to a memory and emulation controller 224. Controller 224 includes a memory controller and a hardware emulation controller as discussed below. Address bus 220 is coupled through drivers 226 to a processor controller 230 (CPUCON) and is coupled through drivers 232 to an interrupt controller 240 (INTCON). Address bus 220 also is coupled through drivers 232 and drivers 234 to shared address bus 160 and is coupled through drivers 232 and drivers 236 to private address bus 124 (FIG. 2). Memory and emulation controller 224 includes an address bus 242 coupled to control store memory 210, an address bus 244 coupled to processor controller 230 and a byte selection bus 246 coupled to processor controller 230. Bus 246 also is coupled through drivers 248 to interrupt controller 240. A data bus 250 is coupled to parity controller 212, processor controller 230 and interrupt controller 240. Data bus 250 also is coupled through drivers 252 to shared data bus 162 and is coupled through drivers 254 to private data bus 126 (FIG. 2). Processor 200 is coupled by an address bus 260, a data bus 262 and a data parity bus 264 to a level 2 cache 270.

As shown in FIG. 3, control store memory 210 is configured to include a primary data area 270, a secondary data area 272, a primary parity area 274 and a secondary parity area 276. By way of example, primary data area 270 and secondary data area 272 may each have a capacity of 16 megabytes and may utilize synchronous DRAM devices. Data bus 202 is coupled to primary data area 270 and to secondary data area 272. Data parity bus 204 is coupled to primary parity area 274 and to secondary parity area 276. Address bus 242 is coupled to data areas 270 and 272 and to parity areas 274 and 276.

By way of example, CPU 200 may comprise a Power PC 750 microprocessor which operates at 266 MHz and includes a 32 kilobyte level 1 cache. Level 2 cache 260 may have a capacity of 1 megabyte. Data bus 250 may operate at a speed of 33 MHz.

Figure 4:
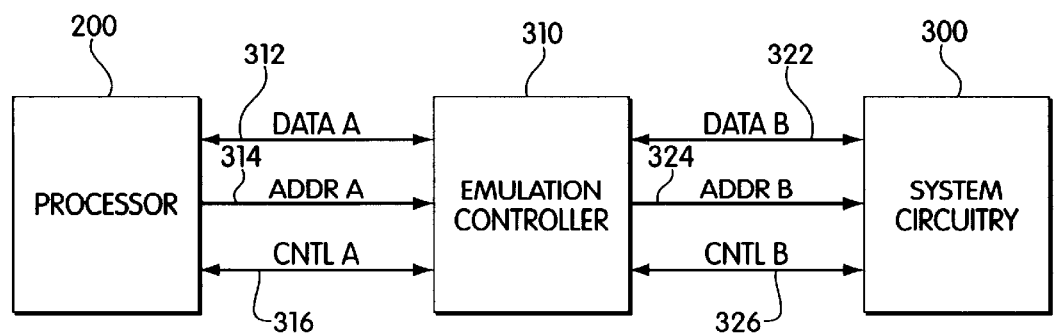
FIG. 4 is a block diagram of a hardware emulation feature of the invention.

According to an aspect of the invention, the CPU block shown in FIG. 3 may be configured with a hardware emulation controller as shown in FIG. 4. Processor 200 is of a first processor type, such as a Power PC microprocessor, and system circuitry 300 is configured for operation with a processor of a second processor type, such as a 68060 microprocessor. This configuration may be utilized, for example, where it is desirable to replace a current processor in an existing system with an new processor having enhanced performance, while retaining some or all of the existing system circuitry. The new processor enhances the operation of the system, but does not require a complete system redesign. In this situation, it is probable that certain signal lines for the new processor, such as data lines, address lines and control lines, will differ from the signal lines of the current processor. Some of the signal lines may differ in operating characteristics, whereas certain signal lines in one processor may have no counterpart in the other processor.

In order to permit operation of the new processor with the existing system circuitry, an emulation controller 310 is utilized as shown in FIG. 4. Emulation controller 310 serves as an interface between processor 200 and system circuitry 300. A data bus 312, an address bus 314 and control lines 316 are coupled between processor 200 and emulation controller 310. A data bus 322, an address bus 324 and control lines 326 are coupled between system circuitry 300 and emulation controller 310. It will be understood that some of the signals are bidirectional and others of the signals are unidirectional. In some cases, emulation controller 310 generates the necessary signals by translation or modification of signals received from processor 200 or system circuitry 300. In other cases, emulation controller 310 generates necessary signals by combining or dividing signals received from processor 200 or system circuitry 300. In still other cases, the signals require no modification.

The emulation controller 310 may be described with reference to a specific example wherein processor 200 comprises a Power PC 750 microprocessor, and system circuitry 300 is configured for operation with a 68060 microprocessor. In the example shown in FIG. 3 and described above, emulation controller 310 is incorporated into memory and emulation controller 224, and system circuitry 300 includes the circuitry below dashed line 330, as well as the circuitry shown in FIG. 2 that is external to processors 120 and 122.

The emulation controller 310 makes the Power PC processor look like a 68060 processor to system circuitry 300. In particular, the most significant 12 bits of the address bus 312 of the Power PC are modified to satisfy 68060 addressing requirements. Modification of data lines is not required in this example. With respect to control lines, the Power PC Transaction Type signals TT0–4 are mapped to create Transaction Type signals TT1–0 for the 68060 circuitry. Power PC Transfer Size signals TSIZ0–2 and TBST are mapped to Size signals SIZ1–0 for the 68060 circuitry. The Power PC Transfer Start signal TS does not require conversion, but may be delayed before it is passed to the 68060 circuitry. The 68060 Transfer In Progress signal TIP is created from the Power PC Transfer Acknowledge signal TA and Transfer Start signal TS. The Power PC Transfer Error signal TEA is generated from the 68060 Transfer Error signal TEA and local errors, such as decode errors and 68060 timing mismatches. The Power PC Transfer Acknowledge signal TA is generated from the 68060 Transfer Acknowledge signal TA, with a one clock cycle delay. The 68060 Byte Select signals BS3–0 are generated from the Power PC Address lines A29–31 and Transfer Size signals TSIZ0–2. The read/write signal required by the 68060 circuitry is generated by decoding the Power PC Transfer Type signals TT0–4. The Power PC Address Acknowledge signal AACK is generated by emulation controller 310, since the 68060 circuitry does not have this signal. The emulation controller 310 also notifies the Power PC of errors using the Transfer Error signal TEA. Examples of errors include address parity errors and RAM and I/O read/write parity errors.

Figure 5:
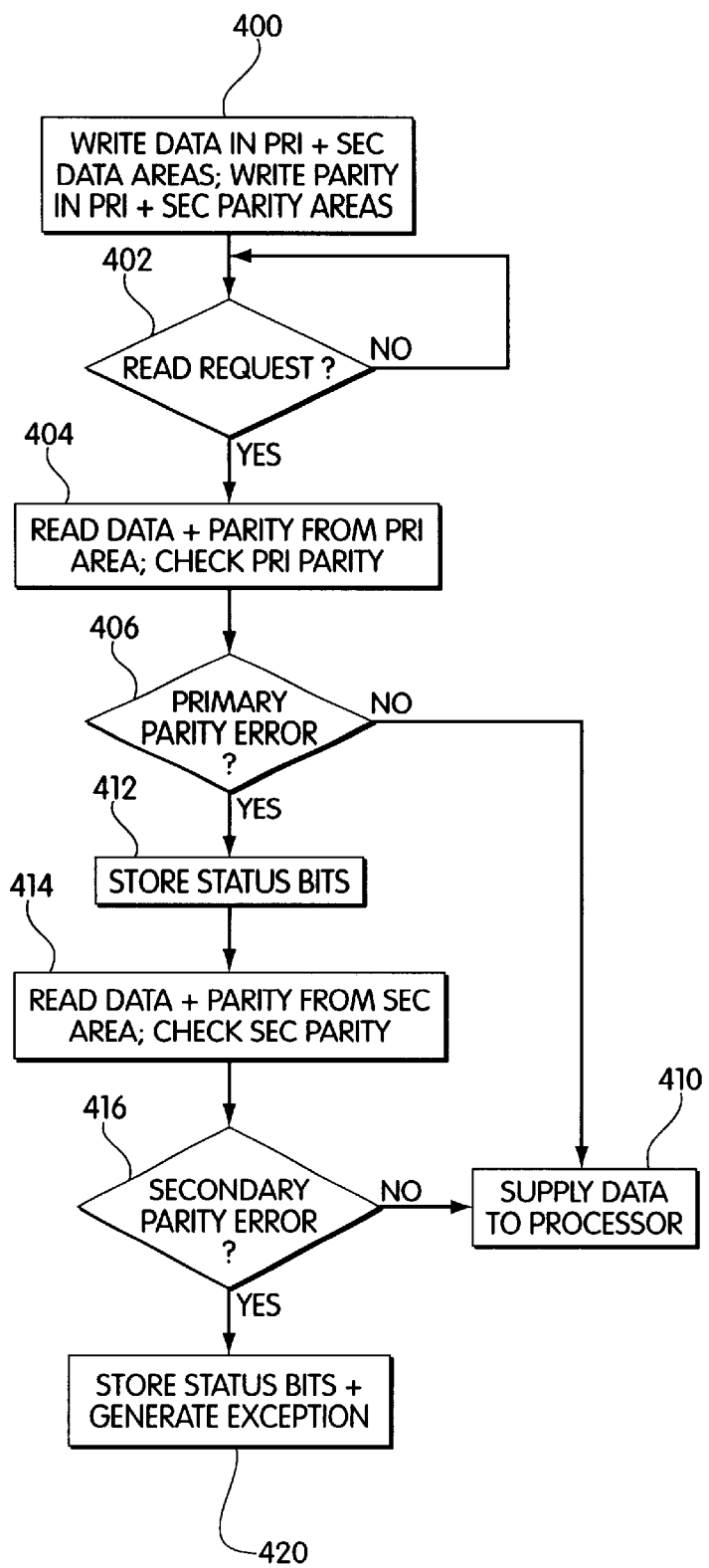
FIG. 5 is a flow diagram that illustrates a memory control feature of the invention.

Operation of control store memory 210 in accordance with another aspect of the invention is described with reference to FIGS. 3 and 5. Memory control operations shown in FIG. 5 are performed by a memory controller portion of the memory and emulation controller 224 shown in FIG. 3. The configuration of FIG. 3 utilizes dual read and write operations to provide extremely high reliability. As described above, control store memory 210 includes primary and secondary data areas 270 and 272, and primary and secondary parity areas 274 and 276.

In a dual write mode, processor 200 in step 400 writes data words in both primary data area 270 and secondary data area 272, and writes corresponding parity words in both primary parity area 274 and secondary parity area 276. In the example of FIG. 3, memory 210 stores 32-bit data words and utilizes byte parity. Thus, the parity words stored in primary and secondary parity areas 274 and 276 are four bits each.

When a read request is received by controller 224 in step 402, controller 224 reads a data word from primary data area 270 and reads a corresponding parity word from primary parity area 274 in step 404. Controller 224 provides an appropriate address to control store memory 210 on address bus 242. The parity of the accessed data word from primary data area 270 is checked by parity controller 212 against the corresponding parity word from primary parity area 274 in step 404. If a primary parity error is not detected ("good" parity) in step 406, the process proceeds to step 410, and the accessed data word from primary data area 270 is supplied to processor 200. If a parity error is detected in step 406, one or more status bits indicative of the parity error are stored in a status register in step 412. Controller 224 then reads the requested data word from secondary data area 272 and reads the corresponding parity word from secondary parity area 276 in step 414. The parity of the data word accessed in secondary data area 272 is checked by parity controller 212 against the corresponding parity word from secondary parity area 276 in step 414. If a secondary parity error is not detected in step 416, the process proceeds to step 410, and the accessed data word is supplied to processor 200. If a secondary parity error is detected in step 416, one or more status bits indicative of the parity error are stored in the status register in step 420, and an exception is generated. The exception causes the processor to stop executing the current instructions and to execute a service routine. Following the read request by processor 200 in step 402, the reading of data from primary data area 270 and, if necessary, from secondary data area 272 is controlled by controller 224 without intervention by or notification of processor 200.

An additional aspect of the invention is described with reference to FIGS. 6–8B. As described above, it is essential to provide high reliability in computer storage systems. Accordingly, it is customary to test such systems over a range of operating supply voltages and operating temperatures. During such tests, supply voltages may be adjusted to their worst case limits, and proper operation of the system is verified. Digital components of computer memory systems of the type described above typically require a 5 volt DC power supply. Specific components may require additional DC voltages. For example, where the processor 200 shown in FIG. 3 is implemented as a Power PC microprocessor, DC supply voltages of 3.3 volts and 2.6 volts are required. In addition to normal operating limits placed on the voltages, certain limits on the individual supply voltages and on the difference between supply voltages must be observed at all times, including during power-up. Failure to meet these requirements may result in destruction of the microprocessor.

Figure 6:
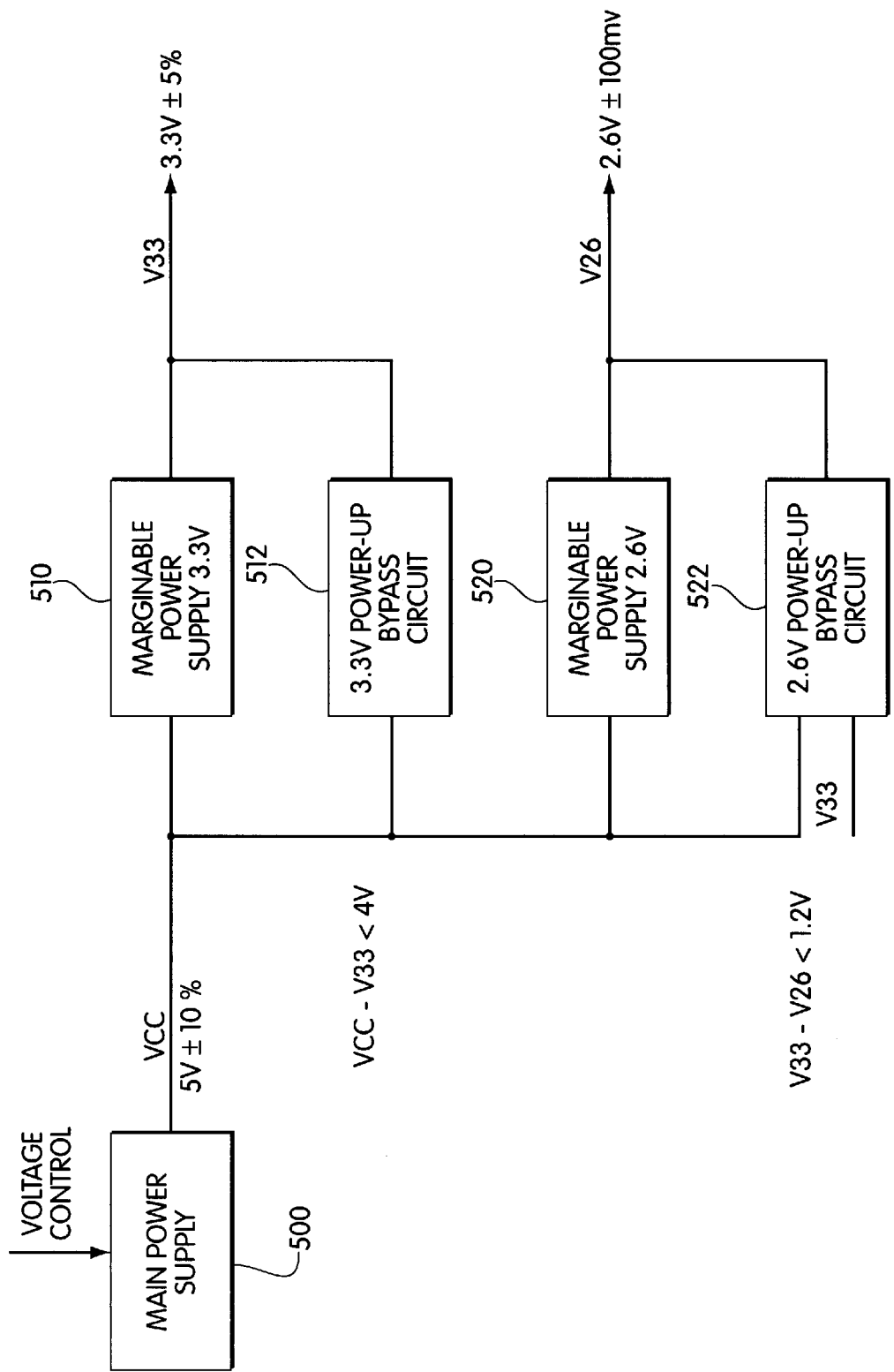
FIG. 6 is a block diagram that illustrates a power supply configuration that incorporates features of the invention.

A block diagram of a power supply system suitable for meeting these requirements is shown in FIG. 6. A main power supply 500 supplies a 5 volt DC supply voltage to each of the directors and to the system cache memory (see FIG. 1). The disk array system is typically implemented as a plurality of printed circuit boards mounted in a backplane. Each director may be packaged as a printed circuit board. The backplane provides interconnections between the directors, the system cache memory, the host computer and the disk array. The main power supply 500 is typically located external to the backplane and supplies a voltage VCC to each of the director boards.

As shown in FIG. 6, a marginable 3.3 volt power supply 510, a 3.3 volt power-up bypass circuit 512, a marginable 2.6 volt power supply 520 and a 2.6 volt power-up bypass circuit 522 are located on each of the director boards. The 3.3 volt power-up bypass circuit 512 is connected in parallel with the 3.3 volt power supply 510, and the 2.6 volt power-up bypass circuit 522 is connected in parallel with the 2.6 volt power supply 520. Power-up bypass circuits 512 and 522 operate during the transient period when power is being turned on. During normal operation, 3.3 volt power supply 510 receives a 5 volt DC supply voltage VCC from main power supply 500 and outputs a 3.3 volt DC supply voltage V33. The 2.6 volt power supply 520 receives supply voltage VCC from main power supply 500 and outputs a 2.6 volt DC supply voltage V26.

The output voltage of main power supply 500 may be adjusted between prescribed limits during system test. In particular, supply voltage VCC may be varied within a range of 5 volts ±10%. It is also desirable to vary simultaneously and proportionally the voltage V33 output by power supply 510 and the voltage V26 output by power supply 520 within prescribed limits in order to achieve complete testing of the system. The variation of V26 and V33 may be executed automatically, without requiring additional control signals.

Figure 7:
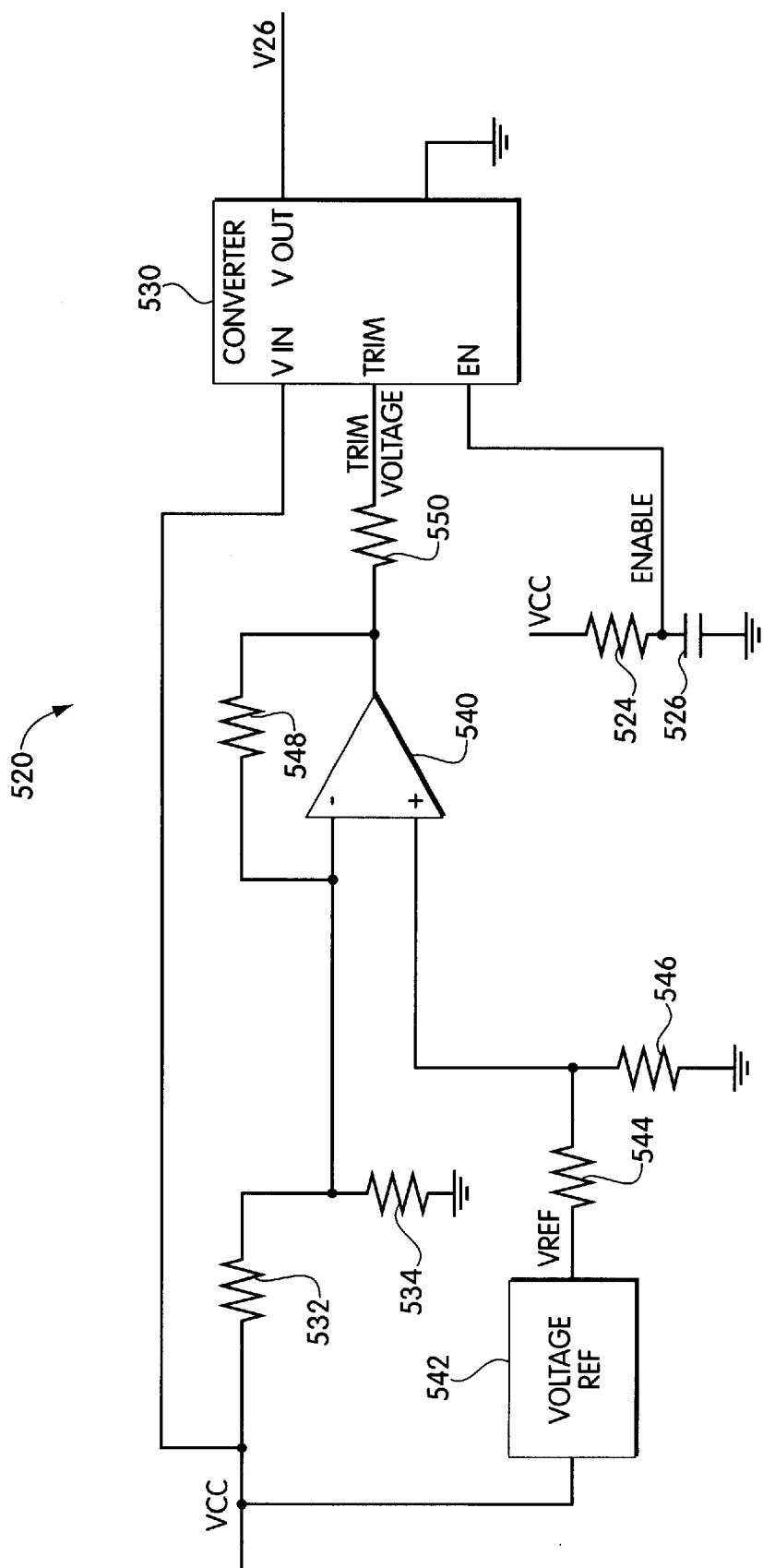
FIG. 7 is a schematic diagram that is representative of each of the marginable power supplies shown in FIG. 6.

A simplified schematic diagram of marginable 2.6 volt power supply 520 is shown in FIG. 7. A DC-DC converter 530 converts the 5 volt supply voltage VCC to 2.6 volt supply voltage V26. The converter 530 includes a trim input which permits output voltage V26 to be adjusted. In typical prior art applications, a fixed resistor is attached to the trim input, and converter 530 maintains a fixed output voltage V26 when the input supply voltage VCC varies within prescribed limits. The circuit of FIG. 7 permits the 2.6 volt supply voltage V26 to be varied when supply voltage VCC is varied. Furthermore, the range of variation of supply voltage V26 may be different from the range of variation of supply voltage VCC.

A resistor 524 and a capacitor 526 are connected in series between supply voltage VCC and ground. The junction between resistor 524 and capacitor 526 is connected to an enable input of DC-DC converter 530. This arrangement causes the operation of DC-DC converter 530 during power-up to be delayed relative to the rise of supply voltage VCC, as described below.

Supply voltage VCC is input through a voltage divider including resistors 532 and 534 to the inverting input of an operational amplifier 540. Supply voltage VCC is also input to a voltage reference generator 542 which outputs a fixed reference voltage VREF, such as 4.5 volts. The reference voltage VREF is input through a voltage divider including resistors 544 and 546 to the non-inverting input of operational amplifier 540. A feedback resistor 548 is coupled between the output and the inverting input of operational amplifier 540. The output of operational amplifier is connected through a resistor 550 to the trim input of DC-DC converter 530.

Figure 8A:
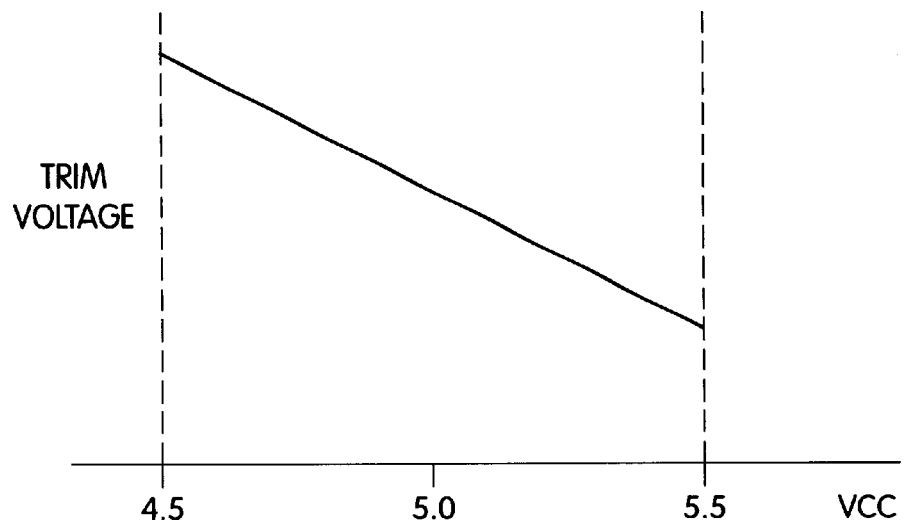
FIGS. 8A and 8B are graphs that illustrate operation of the marginable power supply shown in FIG. 7.
Figure 8B:
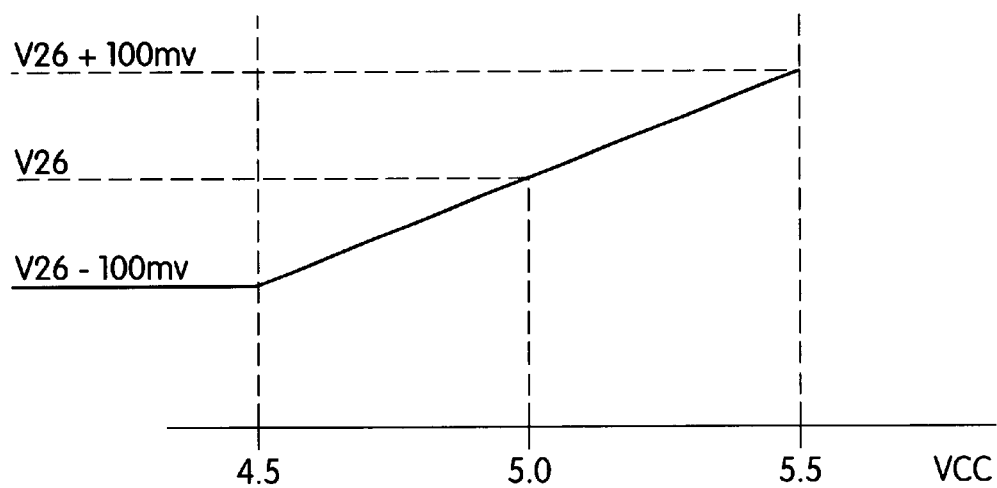

Operation of the circuit of FIG. 7 is described with reference to FIGS. 8A and 8B. FIG. 8A is a graph of trim voltage at the trim input of converter 530 as a function of supply voltage VCC. FIG. 8B is a graph of the supply voltage V26 output by converter 530 as a function of supply voltage VCC. Referring again to FIG. 7, supply voltage VCC is compared with reference voltage VREF by the comparator circuit including operational amplifier 540. The circuit values are selected such that when supply voltage VCC is 5.0 volts, the trim voltage produces an output supply voltage V26 of 2.6 volts. As supply voltage VCC increases from 5.0 volts toward 5.5 volts, the trim voltage decreases, as shown in FIG. 8A, causing the output supply voltage V26 to increase, as shown in FIG. 8B. Conversely, as supply voltage VCC decreases from 5.0 volts toward 4.5 volts, the trim voltage increases, causing the output supply voltage V26 to decrease.

It may be observed that the percentage change in output supply voltage V26 differs from the percentage change in the input supply voltage VCC. In the example of FIGS. 8A and 8B, supply voltage VCC changes by ±10%, whereas output supply voltage V26 changes by ±100 millivolts. It will be understood that the change in output supply voltage V26 relative to the change in supply voltage VCC is a function of the gain of the operational amplifier circuit that supplies the trim voltage to converter 530 and can be increased or decreased by adjusting the circuit gain.

The 3.3 volt power supply 510 shown in FIG. 6 may have the same configuration as power supply 520 of FIG. 7, with appropriate changes to circuit values to obtain output supply voltage V33 of 3.3 volts ±5% when the input supply voltage VCC is 5.0 volts ±10%.

The power supply shown in FIG. 7 and described above provides the capability of onboard margining of supply voltages with a single external supply voltage. The range of each output supply voltage can be the same or different from the range of the input supply voltage. This configuration simplifies system tests, since a single system power supply voltage can be varied, with other supply voltages automatically varying within prescribed ranges.

Figure 9:
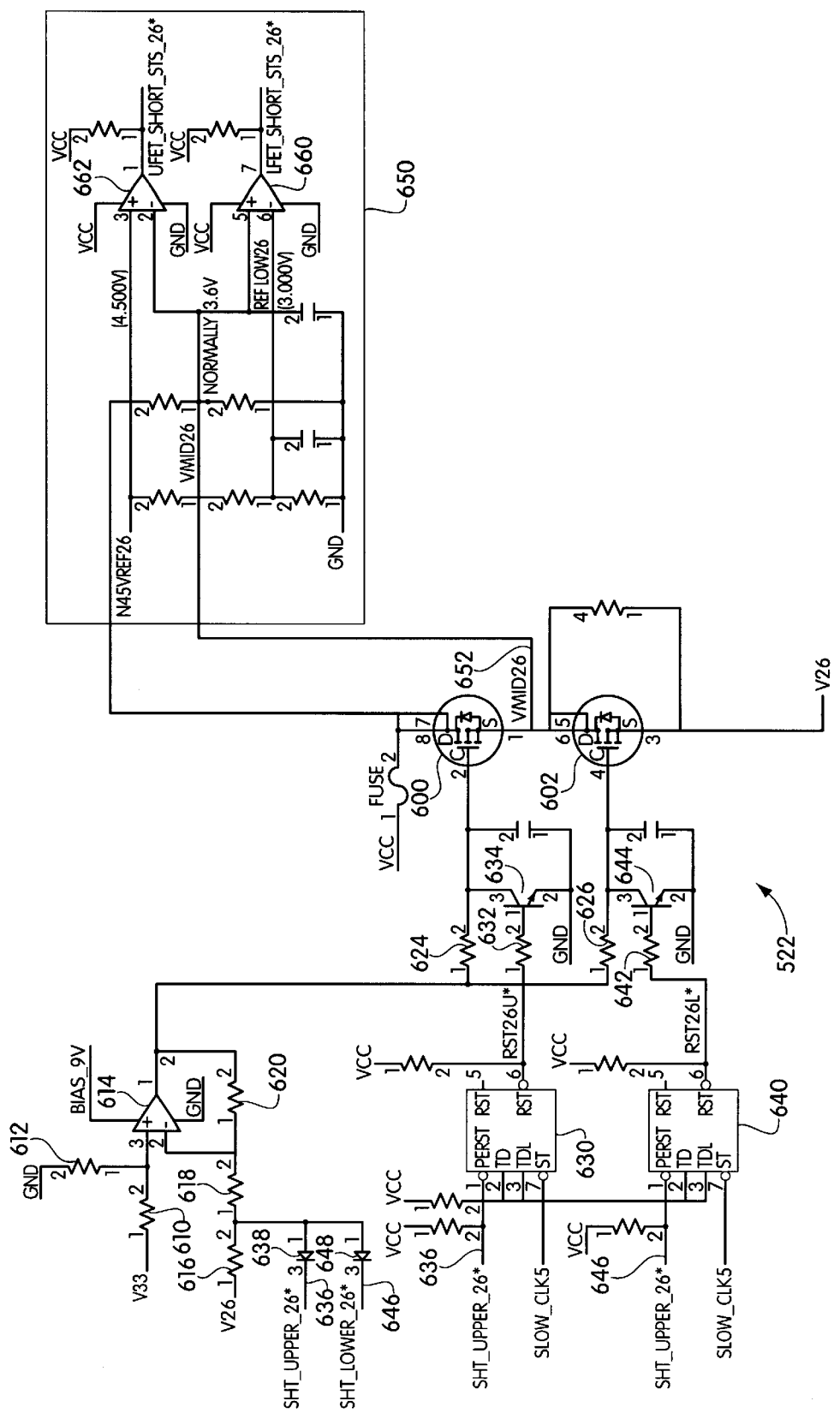
FIG. 9 is a schematic diagram that is representative of each of the power-up bypass circuits shown in FIG. 6.
Figure 10:
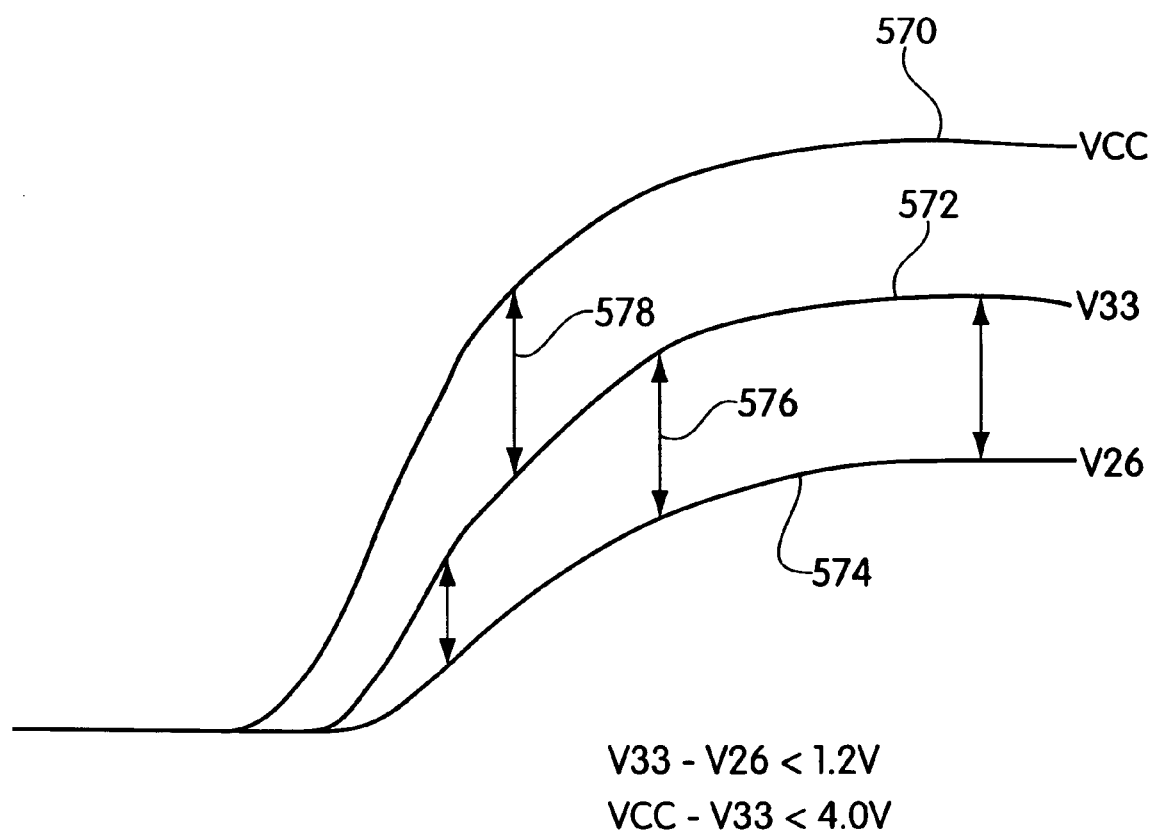
FIG. 10 is a graph that illustrates the interrelation between supply voltages during power-up.
Figure 11:
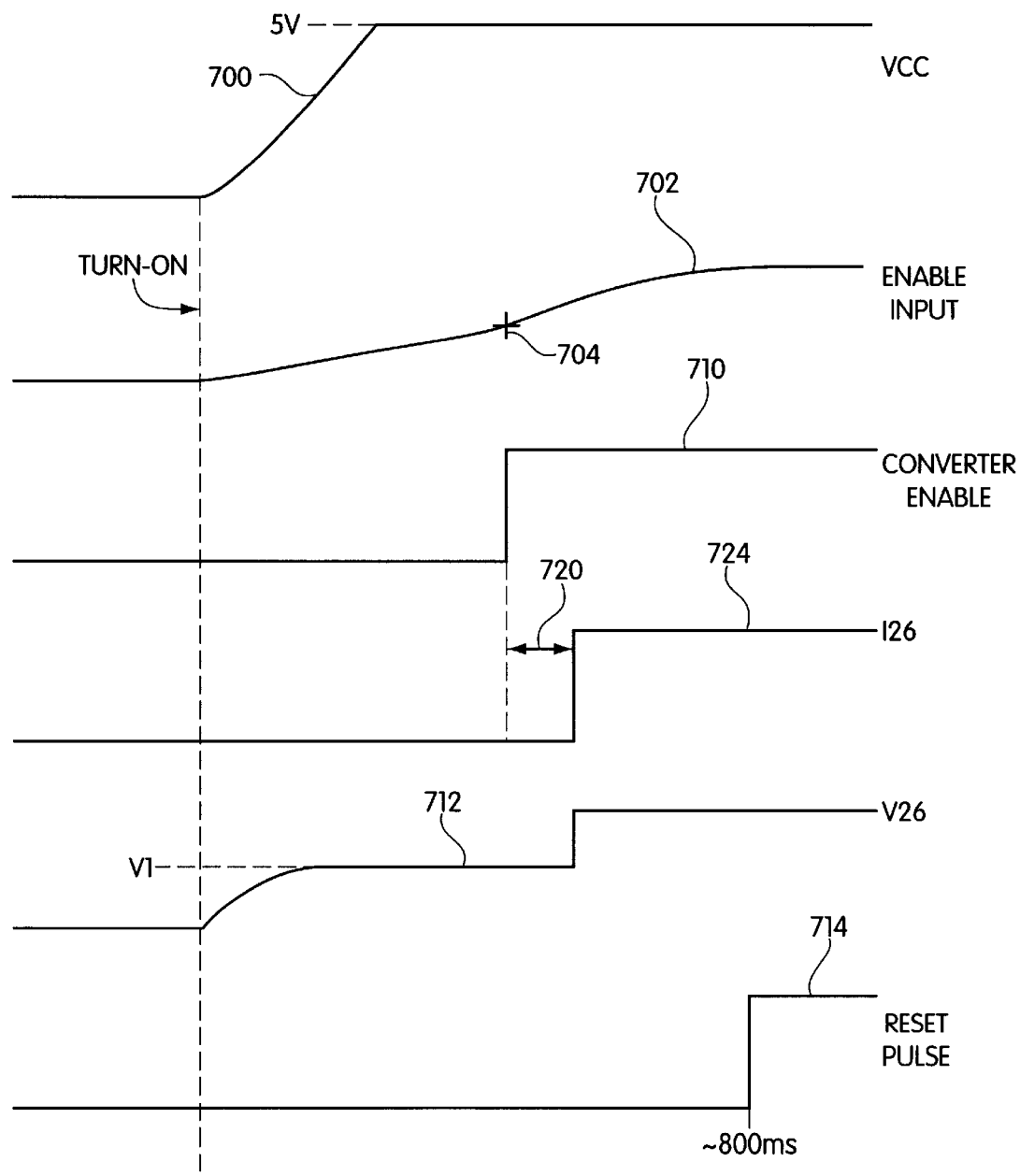
FIG. 11 illustrates examples of waveforms associated with operation of the power supply shown in FIG. 7 and the power-up bypass circuit shown in FIG. 9.

The power-up bypass circuits 512 and 522 are described with reference to FIGS. 9, 10 and 11. A schematic diagram of power-up bypass circuit 522 is shown in FIG. 9. FIG. 10 illustrates the requirements placed on the supply voltages by bypass circuits 512 and 522 during power-up. FIG. 11 illustrates examples of waveforms associated with operation of power supply 520 and bypass circuit 522. Referring to FIG. 9, power-up bypass circuit 522 includes an upper FET 600 and a lower FET 602 connected in series between 5 volt supply voltage VCC and 2.6 volt supply voltage V26. Two FETs are used to provide redundancy. During normal operation, FETs 600 and 602 are turned off, and supply voltage VCC is isolated from supply voltage V26. During power-up, FETs 600 and 602 are turned on by an amount sufficient to control supply voltage V26, as described below. A fuse 604, connected in series with FETs 600 and 602, prevents excessive current from being drawn through FETs 600 and 602.

During power-up, the power supply voltages increase from zero volts to their respective final values. However, the timing of each voltage may be different, depending on the respective loads and other factors. Accordingly, conditions may occur which would damage sensitive circuits, such as processor 200 (FIG. 3). In particular, the Power PC microprocessor requires the quantity (V33–V26) to be less than or equal to 1.2 volts and greater than –0.4 volts at all times, including the transient conditions that occur during power-up. In FIG. 10, waveform 570 represents supply voltage VCC, waveform 572 represents supply voltage V33 and waveform 574 represents supply voltage V26 during power-up. At all times during power-up and normal operation, a difference 576 between supply voltage V33 and supply voltage V26 (V33–V26) must be less than 1.2 volts and must be less than –0.4 volt for proper operation of the Power PC microprocessor. In the example shown in FIG. 9, power-up bypass circuit 522 is more restrictive and requires that the quantity (V33–V26) be less than 1.2 volts during power-up. An additional requirement related to operation of sensitive digital circuitry is that a difference 578 between supply voltage VCC and supply voltage V33 (VCC–V33) be less than 4 volts during power-up. The power-up bypass circuit 512 ensures that this requirement is met.

Power-up bypass circuit 522 shown in FIG. 9 controls supply voltage V26 in response to the quantity (V33–V26) during power-up. The 3.3 volt supply voltage V33 is input through a resistive divider including resistors 610 and 612 to the non-inverting input of an operational amplifier 614. The 2.6 volt supply voltage V26 is input through resistors 616 and 618 to the inverting input of operational amplifier 614, which operates as a differential amplifier having a gain of about 6.5. A feedback resistor 620 is coupled between the output and the inverting input of operational amplifier 614. The output of operational amplifier 614 is coupled through a resistor 624 to the gate of FET 600 and is coupled through a resistor 626 to the gate of FET 602. FETs 600 and 602 are controlled during power-up by the voltage at the output of operational amplifier 614 and operate in a linear portion of their characteristic. Thus, operational amplifier 614 and FETs 600 and 602 constitute a servo loop for controlling supply voltage V26. An error voltage at the output of operational amplifier 614 is proportional to the quantity (V33–V26).

The power-up bypass circuit 522 further includes a reset circuit 630 having an output coupled through a resistor 632 and a transistor 634 to the gate of FET 600. A reset circuit 640 has an output coupled through a resistor 642 and a transistor 644 to the gate of FET 602. Reset circuits 630 and 640 provide reset pulses, which are initiated at turn-on and which may have pulse widths of about 800 milliseconds, during power-up. The pulses turn off transistors 634 and 644, thereby enabling operation of the servo loop described above. During normal operation following timeout of the reset pulses, reset circuits 630 and 640 turn on transistors 634 and 644, respectively, thereby turning FETs 600 and 602 off and inhibiting operation of the servo loop. Transistors 634 and 644 hold FETs 600 and 602 off during normal operation, even if operational amplifier 614 fails high. Reset circuits 630 and 640 receive test signals 636 and 646 as described below. The test signals 636 and 646 are supplied by other logic on the controller board and are set low during diagnostic testing for purposes of verifying operation of the power-up bypass circuit. Test signals 636 and 646 additionally are coupled to operational amplifier 614 via diodes 638 and 648 to enable operational amplifier 614 to supply a signal sufficient to turn on FET 600 or 602.

FIG. 11 is a timing diagram that illustrates the operation of the power-up bypass circuit 522 and illustrates the relationship between power-up bypass circuit 522 and power supply 520. During a portion of the power-up period, DC-DC converter 530 (FIG. 7) is inhibited. As shown in FIG. 11, supply voltage VCC increases following turn-on from 0 volts to 5 volts according to a waveform 700. The converter enable input, as indicated by waveform 702, increases until a threshold value 704 is reached. After threshold 704 is crossed, DC-DC converter 530 is enabled, as indicated by waveform 710. The power-up characteristic of supply voltage V26 is indicated by waveform 712. Prior to the time when DC-DC converter 530 is enabled, bypass circuit 522 controls supply voltage V26. In particular, reset circuits 630 and 640 provide reset pulses, indicated by waveform 714, which enable the operation of the servo loop including operational amplifier 614 and FETs 600 and 602. Operational amplifier 614 outputs an error voltage, proportional to the quantity (V33–V26), which turns on FETs 600 and 602 and causes supply voltage V26 to increase to a value V1, typically in the range of about 1 to 2 volts. Following a delay 720 after DC-DC converter 530 is enabled, DC-DC converter 530 begins operation and outputs a current 126, indicated by waveform 724. In addition, DC-DC converter 530 causes supply voltage V26 to increase from voltage V1 to its nominal value of 2.6 volts (waveform 712). After timeout of the reset pulses, indicated by waveform 714, FETs 600 and 602 are turned off by transistors 634 and 644, respectively, and bypass circuit 522 is inhibited.

Power-up bypass circuit 522 further includes a shorted FET detection circuit 650 for detecting if one of FETs 600 and 602 is shorted. A node 652 between FET 600 and 602 has a nominal voltage of 3.6 volts when FETs 600 and 602 are turned off. Detection circuit 650 includes comparators 660 and 662. Node 652 is connected to the non-inverting input of comparator 660 and to the inverting input of comparator 662. A 3 volt reference voltage is coupled to the inverting input of comparator 660, and a 4.5 volt reference voltage is coupled to the non-inverting input of comparator 662. If the voltage at node 652 drops below the reference voltage at the inverting input of comparator 660, the output of comparator 660 switches to an active state, which indicates that FET 602 is shorted. If the voltage at node 652 exceeds the reference voltage at the non-inverting input of comparator 662, the output of comparator 662 switches to an active state which indicates that FET 600 is shorted. Thus, the outputs of comparators 660 and 662 provide indications as to the operational state of the power-up bypass circuit 522.

Power-up bypass circuit 522 may be tested by application of test signal 636 or 646. When a test signal 636 is applied, reset circuit 630 is caused to output a reset pulse, thereby turning off transistor 634 and enabling FET 600. The test signal 636 supplied through diode 638 causes the output of operational amplifier 614 to increase and to turn on FET 600. The turn on of FET 600 is sensed by comparator 662 which provides an output signal indicating that FET 600 is shorted. Similarly, test signal 646 causes transistor 644 to turn off and FET 602 to turn on, and comparator 660 provides an output signal indicating that FET 602 is shorted. The test signals 636 and 646 thereby verify operation of the reset circuits 630 and 640, the servo loop including operational amplifier 614 and FETs 600 and 602, and detection circuits 650.

Power-up bypass circuit 512 may contain circuitry that is similar to the circuitry of bypass circuit 522 shown in FIG. 9 and described above. However, the dual FETs in the power-up bypass circuit 512 are controlled by a circuit which compares supply voltage VCC with the 3.3 volt supply voltage V33. The FETs and supply voltage V33 are controlled in response to the quantity (VCC−V33). In addition, the reference voltages used in the shorted FET detection circuit are changed to correspond to the 3.3 volt output of the bypass circuit.

Figure 12:
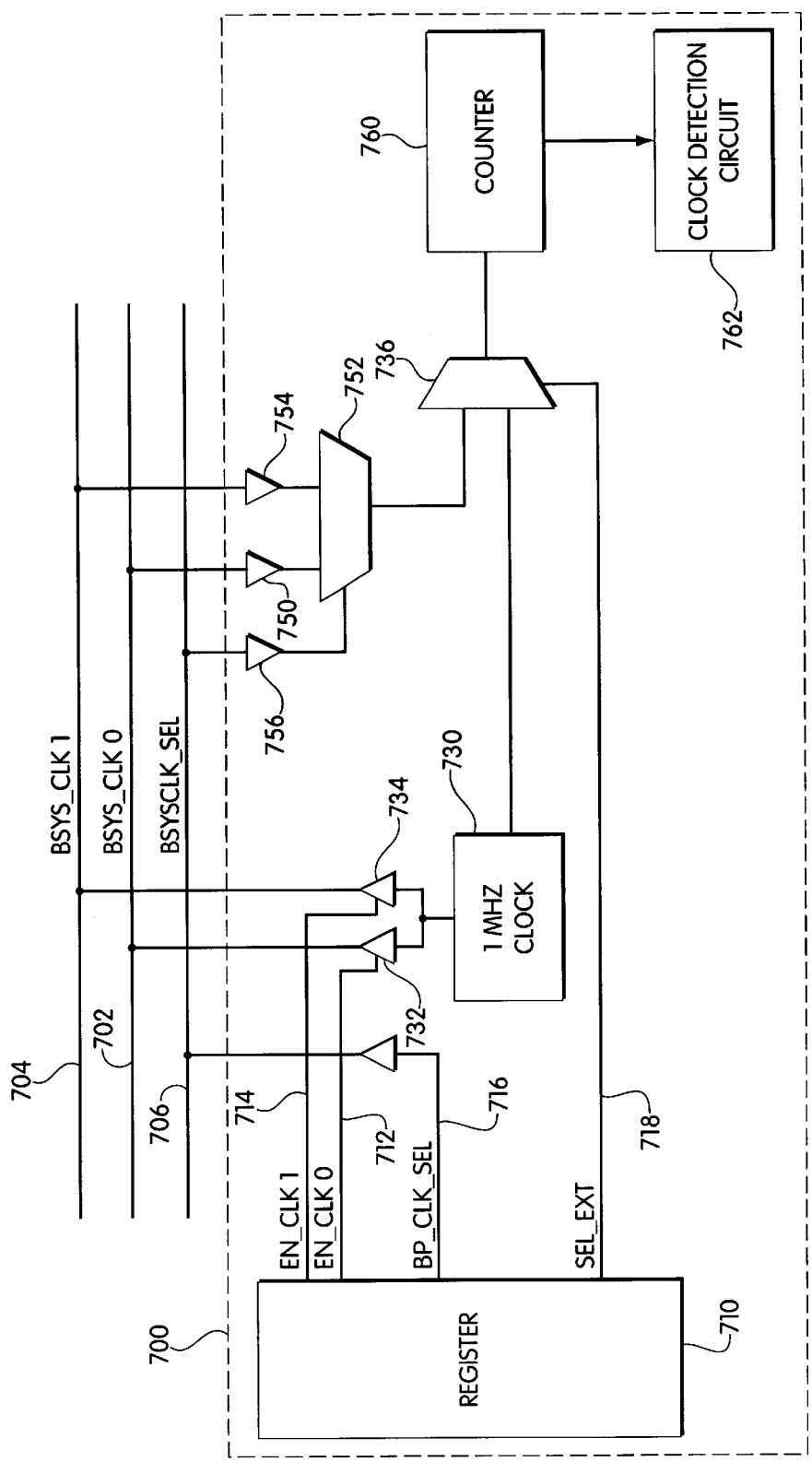
FIG. 12 is a block diagram of a system clock configuration in accordance with another aspect of the invention.

A block diagram of a system clock configuration in accordance with a further aspect of the invention is shown in FIG. 12. As described above, a computer memory system typically includes a plurality of director boards interconnected through a backplane, and each director board includes dual processors. Among the functions performed by the processors on each director board are record keeping, time stamping of events, and the like, which require a clock. It is desirable that all director boards operate in synchronism, so that time stamping and the like are consistent throughout the system. Such a system clock should be highly reliable and should preferably incorporate redundancy.

Referring again to FIG. 12, each director board is provided with a system clock circuit 700. System clock circuit 700 is coupled to similar circuits on other director boards through backplane connections, including a primary clock line 702, designated BSYS_CLK0, a secondary clock line 704, designated BSYS_CLK1, and a clock select line 706, designated BSYSCKL_SEL. Primary clock line 702 carries a primary, or master, clock signal that is distributed to all of the director boards. Secondary clock line 704 carries a secondary, or slave, clock signal that is distributed to all the director boards. The primary and secondary clocks are generated independently. The clock select line 706 is distributed to all of the director boards and causes each of the director boards to select one of the clock lines as the system clock, unless both clocks are inoperative as described below.

The system clock circuit 700 on each of the director boards includes a register 710 containing bits which control the operation of the clock circuit 700. The bits are set by one of the processors 120 or 122 (FIG. 2) on the director board in accordance with an initialization protocol. Those bits includes a primary clock enable bit 712, a secondary clock enable bit 714, a clock select bit 716 and a select external bit 718. System clock circuit 700 further includes a clock 730, which may operate at 1 MHz, having outputs connected to a gate 732, a gate 734 and a first input of a selector 736. Gates 732 and 734 are controlled by the primary clock enable bit 712 and the secondary clock enable bit 714, respectively. Selector 736 is controlled by the select external bit 718. The clock select bit 716 is coupled through a driver 740 to the clock select line 706 on the backplane.

Primary clock line 702 on the backplane is connected through a driver 750 to a first input of a selector 752, and secondary clock line 704 is coupled through a driver 754 to a second input of selector 752. Clock select line 706 on the backplane is coupled through a driver 756 to the select input of selector 752. The output of selector 752 is connected to a second input of selector 736. The output of selector 736 is coupled to the count input of a counter 760.

In operation, the register 710 in each of the director boards is initialized by initialization software executed by one of the processors on the director board. One of the director boards is selected to generate the primary system clock, and another of the director boards is designated to generate the secondary system clock. The selection may be predefined. Each director may be assigned an ID in the system. For example, the director having ID 0 may generate the primary system clock, and the director having ID 1 may generate the secondary system clock. In the director that is selected to generate the primary system clock, the primary clock enable bit 712 is set, and the secondary clock enable bit 714 is reset. In the director that is selected to generate the secondary system clock, the secondary clock enable bit 714 is set, and primary clock enable bit 712 is reset. Thus, the primary clock is supplied through gate 732 in one director to primary clock line 702, and the secondary clock is supplied through gate 734 in another director to secondary clock line 704. The primary and secondary clock enable bits 712 and 714 are reset in all other directors. The primary and secondary clock signals are supplied to each of the director boards through drivers 750 and 754, respectively. The clock select bit 716 normally indicates the primary clock and is supplied to each of the director boards through driver 756.

The select external bit normally specifies the external clock (from primary clock line 702 or secondary clock line 704) and is supplied to selector 736. In normal operation, the primary clock is selected as the system clock and is supplied through driver 750, selector 752 and selector 736 to counter 760 in each of the director boards. Counter 760 may be used for a variety of functions related to timekeeping and the like. Counter 760 may be coupled to a clock detection circuit 762. For example, where a predetermined number of clock pulses are missing, it may be determined that the primary clock is malfunctioning. In this instance, the clock detection circuit 762 causes the clock select bit 716 to switch state, and the secondary clock is selected as the system clock. The secondary clock is coupled through driver 754, selector 752 and selector 736 to counter 760 in each of the director boards. Thus, the system remains in synchronism even when the primary clock malfunctions and the secondary clock is selected as the system clock.

In the same manner, the clock detection circuit may detect that a predetermined number of secondary clock pulses are missing. In that case, both the primary clock and the secondary clock are malfunctioning, and the clock detection circuit 762 causes the select external bit 718 to change state. Selector 736 now selects the output of internal clock 730 and supplies the internal clock to counter 760. The other directors similarly detect that the primary clock and secondary clock are malfunctioning and switch to their respective internal clocks. In this case, the system continues to function, but timekeeping operations are not synchronized.

In accordance with a further aspect of the invention, each director board may incorporate a non-volatile memory which stores product data that uniquely identifies the director board. Referring again to FIG. 2, each director may include a non-volatile memory in the form of a serial electrically-erasable programmable read-only memory (EEPROM) 150 which is part of the shared resources of the director. The serial EEPROM 150 may have a capacity of 4k bytes and may utilize a device that is commercially available from SGS Thomson. Product data stored in the serial EEPROM 150 may include a board part number, a board serial number, a board revision level, a cabinet serial number and text comments. It will be understood that more or less product data may be utilized, depending on the application. The product data may be read from serial EEPROM 150 by processors 120 and 122 and may be externally accessed for testing and other purposes. The on-board serial EEPROM 150 is advantageous because product data is stored with the product itself rather than in a host computer or other storage location.

Different aspects of the invention have been described above in connection with a computer storage system. The various aspects of the invention may be used separately or in combination, as required by a particular application. Furthermore, the various aspects of the invention are not limited in their application to computer storage systems, but may be utilized generally.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus comprising:
   a power supply for generating a first supply voltage, wherein said first supply voltage is variable within a first range; and
   a marginable power supply that is powered by said first supply voltage, said marginable power supply comprising:
      a converter for converting said first supply voltage to a second supply voltage; and
      a control circuit responsive to variations of said first supply voltage for controlling said converter such that said second supply voltage is varied within a second range, wherein said first and second supply voltages are varied within said first and second ranges, respectively, by varying said first supply voltage.

2. Apparatus as defined in claim 1 wherein said control circuit includes a reference voltage source for generating a reference voltage and a voltage comparator for generating a trim voltage for controlling said converter in response to a difference between said first supply voltage and said reference voltage.

3. Apparatus as defined in claim 1 wherein said first range is greater than said second range.

4. Apparatus as defined in claim 1 wherein said electronic circuit is located on a circuit board and wherein said power supply is located external to said circuit board.

5. A marginable power supply powered by a first supply voltage that is variable within a first range, comprising:
   a converter for converting said first supply voltage to a second supply voltage; and
   a control circuit responsive to variations of said first supply voltage for controlling said converter such that said second supply voltage is varied within a second range, wherein said second supply voltage is varied within said second range by varying said first supply voltage.

6. An electronic circuit as defined in claim 5 wherein said control circuit includes a reference voltage source for generating a reference voltage and a voltage comparator for generating a trim voltage for controlling said converter in response to a difference between said supply voltage and said reference voltage.

7. An electronic circuit as defined in claim 5 wherein said first range is greater than said second range.

8. Power supply apparatus comprising:
   a power supply for generating a first supply voltage; and
   a bypass circuit for controlling said first supply voltage during power-up, said bypass circuit comprising:
      a sensing circuit for comparing said first supply voltage and a second supply voltage and generating a control signal in response to a difference between said first and second supply voltages;
      a control circuit responsive to said control signal for controlling said first supply voltage; and
      a reset circuit for enabling said control circuit during power-up and for inhibiting said control circuit during normal operation.

9. Power supply apparatus as defined in claim 8 wherein said control circuit comprises at least two FETs connected in series.

10. Power supply apparatus as defined in claim 9 wherein said reset circuit enables said FETs during power-up and inhibits said FETs during normal operation, independent of said control signal.

11. Power supply apparatus as defined in claim 9 wherein said FETs supply current from a voltage source to said first supply voltage during power-up.

12. Power supply apparatus as defined in claim 9 wherein said bypass circuit further comprises a test circuit for detecting a shorted condition of each of said FETs.

13. Power supply apparatus as defined in claim 12 wherein said bypass circuit further comprises means for simulating a shorted FET in response to a test signal.

14. Power supply apparatus as defined in claim 8 wherein said power supply includes a DC-DC converter which is inhibited during at least a portion of said power-up.

15. A method for controlling a supply voltage, comprising the steps of:
   generating a first supply voltage;
   varying said first supply voltage within a first range;
   converting said first supply voltage to a second supply voltage using a DC-DC converter; and
   controlling said DC-DC converter such that said second supply voltage is varied within a second range in response to the step of varying said first supply voltage, wherein said first and second supply voltages are varied within said first and second ranges, respectively, by varying said first supply voltage.

16. A method as defined in claim 15 wherein the step of controlling said converter comprises the steps of generating a reference voltage and generating a trim voltage for controlling said converter in response to a difference between said first supply voltage and said reference voltage.

17. A method for controlling a supply voltage, comprising the steps of:
   generating a first supply voltage;
   comparing said first supply voltage and a second supply voltage and generating a control signal in response to a difference between said first and second supply voltages;
   controlling said first supply voltage in response to said control signal during power-up; and
   enabling said control circuit during power-up and inhibiting said control circuit during normal operation.

* * * * *